(12) United States Patent
Sato et al.

(10) Patent No.: US 8,425,276 B2
(45) Date of Patent: Apr. 23, 2013

(54) POLISHING COMPOSITION

(75) Inventors: Takashi Sato, Shiojiri (JP); Hiroshi Takahashi, Shiojiri (JP); Yoshitomo Shimazu, Shiojiri (JP); Yuji Itoh, Shiojiri (JP)

(73) Assignee: Showa Denko K.K., Tokyo (JP)

( * ) Notice: Subject to any disclaimer, the term of this patent is extended or adjusted under 35 U.S.C. 154(b) by 473 days.

(21) Appl. No.: 12/741,177

(22) PCT Filed: Nov. 12, 2008

(86) PCT No.: PCT/JP2008/070967
§ 371 (c)(1),
(2), (4) Date: May 3, 2010

(87) PCT Pub. No.: WO2009/064010
PCT Pub. Date: May 22, 2009

(65) Prior Publication Data
US 2010/0267315 A1 Oct. 21, 2010

(30) Foreign Application Priority Data
Nov. 14, 2007 (JP) .................................. 2007-295708

(51) Int. Cl.
*B24B 1/00* (2006.01)

(52) U.S. Cl.
USPC .................. 451/36; 451/60; 451/41; 451/446; 451/53; 216/88; 106/3; 252/79.1; 252/79.2; 252/79.4

(58) Field of Classification Search .................... 451/36, 451/41, 60, 446, 53; 438/626, 692, 645, 438/693; 216/88–91; 106/3; 252/79.1–79.5; 51/307–309; 257/E21.23, E21.237, E21.304
See application file for complete search history.

(56) References Cited

U.S. PATENT DOCUMENTS 5,575,885 A * 11/1996 Hirabayashi et al. ........... 438/14

6,217,416 B1 * 4/2001 Kaufman et al. ............... 451/41
(Continued)

FOREIGN PATENT DOCUMENTS

EP        1 870 928 A1    12/2007
JP      2002-249762 A     9/2002
(Continued)

OTHER PUBLICATIONS

Japanese Office Action issued in Japanese Patent Application No. 2007-295708 mailed May 8, 2012.

*Primary Examiner* — George Nguyen
(74) *Attorney, Agent, or Firm* — Sughrue Mion, PLLC (57) ABSTRACT

The present invention provides a polishing composition for polishing copper or copper alloy, comprising: an oxidizing agent (A); at least one acids (B) selected from amino acids, carboxylic acids of 8 or less carbon atoms, or inorganic acids; a sulfonic acid (C) having an alkyl group of 8 or more carbon atoms; a fatty acid (D) having an alkyl group of 8 or more carbon atoms; and an N-substituted imidazole (E) represented by the following general formula (1).

[Chemical 1]

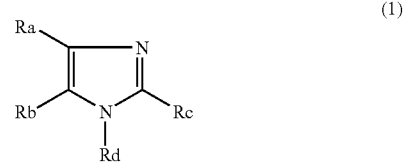

(1)

(In the formula (1), Ra, Rb, and Rc represent H or an alkyl group of 1 to 4 carbon atoms, and Rd represents a group selected from the group consisting of a benzyl group, a vinyl group, an alkyl group of 1 to 4 carbon atoms, and a group in which a portion of H of these groups has been substituted with OH or $NH_2$.)

17 Claims, 2 Drawing Sheets

U.S. PATENT DOCUMENTS

| | | | |
|---|---|---|---|
| 6,426,294 B1 * | 7/2002 | Hirabayashi et al. | 438/690 |
| 6,547,843 B2 * | 4/2003 | Shimazu et al. | 51/309 |
| 6,750,128 B2 * | 6/2004 | Kondo et al. | 438/591 |
| 6,773,476 B2 * | 8/2004 | Sakai et al. | 51/307 |
| 6,786,945 B2 * | 9/2004 | Machii et al. | 51/307 |
| 7,367,870 B2 | 5/2008 | Kurata et al. | |
| 7,410,409 B1 * | 8/2008 | Koyama et al. | 451/36 |
| 8,002,860 B2 * | 8/2011 | Koyama et al. | 51/307 |
| 8,084,363 B2 * | 12/2011 | Amanokura et al. | 438/692 |
| 2002/0142586 A1 * | 10/2002 | Shiota | 438/633 |
| 2004/0065022 A1 * | 4/2004 | Machii et al. | 51/309 |
| 2004/0171264 A1 * | 9/2004 | Kondo et al. | 438/691 |
| 2005/0136670 A1 | 6/2005 | Ameen et al. | |
| 2005/0159003 A1 | 7/2005 | Weinstein et al. | |
| 2005/0181609 A1 | 8/2005 | Kurata et al. | |
| 2006/0163083 A1 | 7/2006 | Andricacos et al. | |
| 2007/0049180 A1 * | 3/2007 | Shida et al. | 451/41 |
| 2007/0069176 A1 | 3/2007 | Kato | |
| 2007/0082456 A1 * | 4/2007 | Uotani et al. | 438/427 |
| 2007/0128872 A1 * | 6/2007 | Itoh et al. | 438/691 |
| 2007/0169421 A1 * | 7/2007 | Koyama et al. | 51/298 |
| 2007/0270085 A1 * | 11/2007 | Ota et al. | 451/36 |
| 2008/0067077 A1 * | 3/2008 | Kodera et al. | 205/645 |
| 2008/0200033 A1 * | 8/2008 | Takemiya | 438/693 |
| 2009/0017636 A1 * | 1/2009 | Kumazawa et al. | 438/745 |
| 2009/0093118 A1 | 4/2009 | Uotani et al. | |
| 2009/0156007 A1 * | 6/2009 | Amanokura et al. | 438/693 |
| 2011/0059680 A1 * | 3/2011 | Motonari et al. | 451/36 |

FOREIGN PATENT DOCUMENTS

| | | |
|---|---|---|
| JP | 2005-167231 A | 6/2005 |
| JP | 2005-217395 A | 8/2005 |
| JP | 2005-340755 A | 12/2005 |
| JP | 2006-520530 A | 9/2006 |
| JP | 2007-088379 A | 4/2007 |
| JP | 2008-529272 A | 7/2008 |
| JP | 2009-087967 A | 4/2009 |
| KR | 1020050006203 A | 1/2005 |
| TW | 200526770 | 8/2005 |
| TW | 200710209 | 3/2007 |
| WO | 2004/069947 A1 | 8/2004 |
| WO | 2005/047409 A1 | 5/2005 |
| WO | 2006/088533 A2 | 8/2006 |
| WO | 2006/112519 A1 | 10/2006 |

* cited by examiner

POLISHING COMPOSITION

TECHNICAL FIELD

The present invention relates to a polishing composition, a polishing method, a composition forming the polishing composition or a kit comprising a plurality of types of compositions forming the polishing composition, and a method for producing a semiconductor device, and in particular relates to a polishing composition suitably used when polishing a metal film formed on a substrate.

Priority is claimed on Japanese Patent Application No. 2007-295708, filed Nov. 14, 2007, the content of which is incorporated herein by reference.

BACKGROUND ART

In the field of semiconductor devices such as an Integrated Circuit (IC), Large Scale Integration (LSI), and Magnetoresistive Random Access Memory (MRAM), attempts have been made to reduce the wiring size, the wiring resistance, and the dielectric constant of an interlayer insulating film in order to improve the operating speed and the degree of integration. As for the wiring metals, copper or copper alloy has been employed due to recent problems such as wire delay.

Such copper or copper-alloy wiring is formed by, for example, the damascene method. In the damascene method, generally, grooves (concave portions) serving as the wiring portion are formed on an interlayer insulating film, and copper or copper alloy is deposited thereon, or, after the formation of such grooves, a thin barrier film of tantalum or tantalum nitride is formed on the surface of the interlayer insulating film including these grooves, followed by deposition of copper or copper alloy thereon. At this time, excessive copper or copper alloy is deposited. Thus, planarization is carried out by removing the excessive copper or copper alloy through polishing by a Chemical Mechanical Polishing (CMP) method until the interlayer insulating film or the barrier film is exposed. By so doing, wiring composed of copper or copper alloy embedded in grooves is formed in semiconductor devices.

As a polishing technique by using the CMP method, for example, there is a technique for polishing a substrate having a silicon-containing dielectric layer which uses a CMP system comprising an abrasive, a polishing additive having a functional group of pKa 3 to 9, and a liquid carrier (for example, refer to Published Japanese translation No. 2006-520530 of PCT International Publication). According to the technique described in the above Patent Document, the CMP system can exhibit desirable planarization efficiency, selectivity, uniformity, and removal rate, while minimizing defects.

Moreover, as another polishing technique by using the CMP method, there is a polishing method which uses an abrasive containing a polishing additive comprising an amidine compound and/or a quaternary salt of an amidine compound (for example, refer to Japanese Unexamined Patent Application, First Publication No. 2002-249762).

DISCLOSURE OF INVENTION

In recent years, in response to the tendency for microfabrication and high-integration, wiring using copper or copper alloy has been formed as multilayers, and therefore improvement in the planarity of each layer has been required. As described above, in the damascene method, polishing may be performed until a barrier film or an interlayer insulating film is exposed on the surface. However, if the polishing is actually performed, errors occur in the polishing amount because the subject surface is unevenly polished. Therefore, usually, when the damascene method is performed, excessive copper or copper alloy is reliably removed by polishing over a long time (called overpolishing) beyond the point in time at which the excessive copper or copper alloy has been removed (called endpoint).

However, when overpolishing is performed, surface polishing is continued beyond the end point. Therefore, there may be a dishing phenomenon in which the wiring metal is further polished to make a concave in an area having a wide wiring, and/or an erosion phenomenon in which not only the wiring metal but also the barrier film and the interlayer insulating film are polished in an area having highly densified wiring, which creates a problem of lowering the planarity. In particular, erosion is apt to occur in recent wiring patterns of high density, which is problematic.

In addition, high planarity creates a problem in that a residual wiring metal of copper or copper alloy easily remains on the interlayer insulating film or the barrier film, even if overpolishing has been appropriately performed. If there is such a residual wiring metal, choices are limited for polishing the barrier film or shaving the interlayer insulating film at the next step. Specifically, for example, usable polishing compositions are limited.

Moreover, copper and copper alloys for use as wiring metals are materials which can hardly be polished at a practically sufficient polishing speed solely with an abrasive. For example, if the concentration of the abrasive is increased so as to increase the polishing speed, damage such as scratches easily occurs in the wiring metal. As a method for solving this problem, there is a method in which an etching agent is added to an abrasive so as to keep a relatively low concentration of the abrasive so that a practically sufficient polishing speed can be provided while preventing the occurrence of damage in the wiring metal. However, when an etching agent is added to an abrasive, copper or copper alloy for use as the wiring is excessively polished, creating a problem of worsening dishing and/or a problem of causing corrosion of the copper or copper alloy.

The abovementioned problems of dishing and/or erosion, problems of the occurrence of a residual wiring metal, and problems of damage and/or corrosion in the wiring metal when the polishing speed is increased, are unique to CMP in the damascene method. In addition, these problems are caused by simultaneous polishing of different types of materials such as the wiring metal and the interlayer insulating film or the barrier film. Accordingly, these problems are different from problems in polishing for planarizing a homogeneous material such as a silicon wafer. Therefore, these problems cannot be solved by designing the polishing composition or the like for polishing homogeneous materials.

For example, the abovementioned technique described in Published Japanese translation No. 2006-520530 of PCT International Publication is a technique for polishing a silicon-containing dielectric layer, and is not a technique for polishing copper and copper alloys for use as wiring. Moreover, the technique described in Japanese Unexamined Patent Application, First Publication No. 2002-249762 is a technique for polishing a silicon wafer, in which there is no description of examples where the technique has been used in polishing of metals, although a possibility for use in polishing of metals has been mentioned.

The present invention has been proposed in view of the above situation, with an object of providing a polishing composition, a polishing method, and a method for producing a semiconductor device, with which damage and corrosion hardly remains on the surface of the wiring metal, a residual wiring metal hardly occurs on the interlayer insulating film and the barrier film, a sufficient polishing speed can be maintained, dishing and erosion can be prevented, and high planarity can be provided.

Moreover, another object of the present invention is to provide a polishing method in which polishing is performed by using the polishing composition of the present invention, a composition forming the polishing composition of the present invention or a kit comprising a plurality of types of compositions forming the polishing composition of the present invention, produced by mixing the plurality of types of compositions, with or without dilution with water.

The present invention provides the following solutions.

(1) A polishing composition for polishing copper or copper alloy, comprising: an oxidizing agent (A); at least one acids (B) selected from amino acids, carboxylic acids of 8 or less carbon atoms, or inorganic acids; a sulfonic acid (C) having an alkyl group of 8 or more carbon atoms; a fatty acid (D) having an alkyl group of 8 or more carbon atoms; and an N-substituted imidazole (E) represented by the following general formula (I).

[Chemical 1]

(1)

(In the formula (I), Ra, Rb, and Rc represent H or an alkyl group of 1 to 4 carbon atoms, and Rd represents a group selected from the group consisting of a benzyl group, a vinyl group, an alkyl group of 1 to 4 carbon atoms, and a group in which a portion of H of these groups has been substituted with OH or $NH_2$.)

(2) The polishing composition according to (1), wherein the N-substituted imidazole is at least one selected from N-vinylimidazole, N-methylimidazole, N-ethylimidazole, N-benzylimidazole, 1,2-dimethylimidazole, N-butylimidazole, or N-(3-aminopropyl)-imidazole.

(3) The polishing composition according to (1) or (2), wherein a concentration of the N-substituted imidazole is 0.005 to 3 mass %.

(4) The polishing composition according to any one of (1) to (3), further comprising an abrasive.

(5) The polishing composition according to any one of (1) to (4), wherein a pH thereof is 9 to 11.

(6) The polishing composition according to any one of (1) to (5), further comprising ammonia.

(7) The polishing composition according to any one of (1) to (6), wherein the oxidizing agent (A) is a persulfate.

(8) The polishing composition according to any one of (1) to (7), wherein the at least one acid (B) selected from amino acids, carboxylic acids of 8 or less carbon atoms, or inorganic acids is oxalic acid.

(9) The polishing composition according to any one of (1) to (8), wherein the sulfonic acid (C) having an alkyl group of 8 or more carbon atoms is alkylbenzene sulfonic acid.

(10) The polishing composition according to any one of (1) to (9), wherein the fatty acid (D) having an alkyl group of 8 or more carbon atoms is oleic acid or lauric acid.

(11) The polishing composition according to (4), wherein the abrasive is colloidal silica.

(12) The polishing composition according to any one of (1) to (11), further comprising a nonionic water-soluble polymer.

(13) A polishing method, wherein a metal film composed of copper or copper alloy embedded on an insulating layer which has concave portions and is provided on a substrate, so as to cover the concave portions, or a metal film composed of copper or copper alloy embedded, through a barrier metal film, on an insulating layer which has concave portions and is provided on a substrate, so as to cover the concave portions, is polished by using the polishing composition according to any one of (1) to (12).

(14) The polishing method according to (13), wherein the barrier metal film is composed of tantalum or tantalum alloy.

(15) A composition providing the polishing composition according to (3) by dilution with water.

(16) A kit comprising a plurality of types of compositions, which provide the polishing composition of any one of (1) to (12) by mixing the plurality of types of compositions.

(17) A method for producing a semiconductor device, comprising forming a wiring by the polishing method according to (13) or (14).

The present invention can provide a polishing composition, with which damage and corrosion hardly occur on the surface of the wiring metal, a residual wiring metal of copper or copper alloy (hereunder, referred to as residual copper) hardly remains on the interlayer insulating film or the barrier film, a sufficient polishing speed can be maintained, dishing and erosion can be prevented, and high planarity can be provided.

Moreover, in the polishing method of the present invention, since polishing is performed by using the polishing composition of the present invention, damage and corrosion hardly occur on the surface of the wiring metal, residual copper hardly remains on the interlayer insulating film or the barrier film, a sufficient polishing speed can be maintained, dishing and erosion can be prevented, and high planarity can be provided.

Furthermore, a composition forming the polishing composition of the present invention or a kit comprising a plurality of types of compositions forming the polishing composition of the present invention are capable of readily providing the polishing composition of the present invention when needed.

BRIEF DESCRIPTION OF THE REFERENCE SYMBOLS

1: Interlayer insulating film, 2: Groove (concave portion), 2': Wiring, 3: Space, 4: Barrier metal film, 5: Metal film

BEST MODE FOR CARRYING OUT THE INVENTION

An embodiment of the present invention is described in detail below.

(Polishing Composition)

The polishing composition of the present embodiment is a polishing composition for polishing copper or copper alloy, comprising: an oxidizing agent (A); at least one acids (B) selected from amino acids, carboxylic acids of 8 or less carbon atoms, or inorganic acids; a sulfonic acid (C) having an alkyl group of 8 or more carbon atoms; a fatty acid (D) having an alkyl group of 8 or more carbon atoms; and an N-substituted imidazole (E).

(Respective Components of Polishing Composition)

(A) Oxidizing Agent

The oxidizing agent is required to oxidize copper or copper alloy serving as the wiring metal to thereby contribute to improvement of the polishing speed. Examples of the usable oxidizing agent can include oxygen; ozone; hydrogen peroxide; an alkyl peroxide such as t-butyl hydroperoxide and ethylbenzene hydroperoxide; a peracid such as peracetic acid and perbenzoic acid; a permanganate such as potassium permanganate; a periodate such as potassium periodate; a persulfate such as ammonium persulfate and potassium persulfate; a hypochlorite such as potassium hypochlorite; and a polyoxo acid. Among these, hydrogen peroxide and persulfate are preferred in view of easy handleability.

The concentration of the oxidizing agent is preferably 0.1 to 5 mass %, more preferably 0.3 to 4 mass %, and yet more preferably 0.5 to 3 mass %, based on the total polishing composition. If the concentration of the oxidizing agent is lower than the above range, a sufficiently high polishing speed may not be provided. On the other hand, if the concentration of the oxidizing agent is higher than the above range, the polishing speed will not be increased any further, which is not economically advantageous.

(B) At Least One Acids Selected from Amino Acids, Carboxylic Acids of 8 or Less Carbon Atoms, or Inorganic Acids The acids functions as an etching agent of copper or copper alloy, and is to be added to promote the polishing process and to perform stable polishing.

Examples of the amino acids can include glycine, alanine, β-alanine, 2-aminobutyric acid, norvaline, valine, leucine, norleucine, isoleucine, alloisoleucine, phenylalanine, proline, sarcocine, ornithine, lysine, taurine, serine, threonine, allothreonine, homoserine, tyrosine, 3,5-diiodo-tyrosine, β-(3,4-dihydroxyphenyl)-alanine, thyroxine, 4-hydroxy-proline, cystine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, kynurenine, histidine, 1-methyl-histidine, 3-methyl-histidine, ergothioneine, and tryptophane.

Examples of the carboxylic acids of 8 or less carbon atoms can include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and a salt thereof.

Examples of the inorganic acids can include sulfuric acid, phosphoric acid, phosphonic acid, and nitric acid.

Among the abovementioned acids, oxalic acid is preferably used since high polishing speed and high planarity can be obtained. The polishing composition may comprise any one type, or a mixture of two or more types, of the abovementioned acids.

The concentration of the acids is preferably 0.05 to 2 mass %, more preferably 0.1 to 1.5 mass %, and yet more preferably 0.2 to 1 mass %, based on the total polishing composition. If the concentration of the acids is lower than the above range, a high polishing speed can be hardly obtained. On the other hand, if the concentration of the acids is higher than the above range, the etching speed of copper or copper alloy may be excessively high, which may lead to frequent occurrence of surface corrosion and reduction in the planarity.

(C) Sulfonic Acid Having an Alkyl Group of 8 or More Carbon Atoms

The sulfonic acid having an alkyl group of 8 or more carbon atoms is necessary to suppress excessive etching action on copper or copper alloy and to prevent dishing when overpolishing is performed, to thereby contribute to improvement of the planarity and to corrosion inhibition.

Examples of the sulfonic acid having an alkyl group of 8 or more carbon atoms can include an alkylsulfonic acid such as decylsulfonic acid and dodecylsulfonic acid; an alkylbenzenesulfonic acid such as decylbenzenesulfonic acid, undecylbenzenesulfonic acid, dodecylbenzenesulfonic acid, tridecylbenzenesulfonic acid, tetradecylbenzenesulfonic acid, and a mixture thereof; and an alkyl aromatic sulfonic acid such as alkylnaphthalenesulfonic acid and a formalin condensate of alkylnaphthalenesulfonic acid; and others. Among these, dodecylbenzenesulfonic acid is preferred in view of industrial availability.

Moreover, the sulfonic acid having an alkyl group of 8 or more carbon atoms may be in the form of a salt such as potassium salt or ammonium salt. Furthermore, the polishing composition may comprise any one type, or a mixture of two or more types, of the abovementioned sulfonic acids having an alkyl group of 8 or more carbon atoms.

The concentration of the sulfonic acid having an alkyl group of 8 or more carbon atoms is preferably 0.01 to 1 mass %, more preferably 0.02 to 0.5 mass %, and yet more preferably 0.02 to 0.3 mass %, based on the total polishing composition. If the concentration of the sulfonic acid having an alkyl group of 8 or more carbon atoms is lower than the above range, the planarity may be lowered. On the other hand, if the concentration of the sulfonic acid having an alkyl group of 8 or more carbon atoms is higher than 1 mass %, the performance will be little improved, which is not economically advantageous.

(D) Fatty Acid Having an Alkyl Group of 8 or More Carbon Atoms

The fatty acid having an alkyl group of 8 or more carbon atoms is to be added in combination with the sulfonic acid (C) having an alkyl group of 8 or more carbon atoms, for improvement of the planarity and the corrosion inhibition, and is particularly effective for suppression of dishing when overpolishing is performed.

Examples of the fatty acid having an alkyl group of 8 or more carbon atoms can include a saturated fatty acid such as caprylic acid, pelargonic acid, capric acid, lauric acid, myristic acid, pentadecylic acid, palmitic acid, margarinic acid, stearic acid, arachic acid, behenic acid, lignoceric acid, cerotic acid, montanic acid, and melissic acid; and an unsaturated fatty acid such as eicosapentaenoic acid, oleic acid, linoleic acid, and linolenic acid. Among these, oleic acid or lauric acid is preferably used.

Moreover, the fatty acid having an alkyl group of 8 or more carbon atoms may be in the form of a salt such as potassium salt or ammonium salt. Furthermore, the polishing composition may comprise any one type, or a mixture of two or more types, of the abovementioned fatty acids having an alkyl group of 8 or more carbon atoms.

The concentration of the fatty acid having an alkyl group of 8 or more carbon atoms is preferably 0.001 to 0.3 mass %, more preferably 0.002 to 0.2 mass %, and yet more preferably 0.003 to 0.1 mass %, based on the total polishing composition. If the concentration of the fatty acid having an alkyl group of 8 or more carbon atoms is lower than the above range, the effect of addition of the fatty acid having an alkyl group of 8 or more carbon atoms may not be sufficiently obtained and the planarity may be lowered. On the other hand, if the concentration of the fatty acid having an alkyl group of 8 or more carbon atoms is higher than 0.3 mass %, residual copper may remain on the barrier film.

Even a single use of either the sulfonic acid (C) having an alkyl group of 8 or more carbon atoms (hereinafter, may be abbreviated as (C)) or the fatty acid (D) having an alkyl group of 8 or more carbon atoms (hereinafter, may be abbreviated as (D)) is capable of providing an effect of inhibiting severe corrosion that dissolves almost the majority of the wiring metal, although the joint use of (C) and (D) is more effectively capable of providing an effect of improving the planarity. (C) and (D) are considered to exert their functions by being absorbed onto the surface of copper or copper alloy serving as the wiring metal. Moreover, the joint use of (C) and (D) is expected to improve the absorptivity onto the surface of the wiring metal so as to provide a higher planarity, as compared to a single use thereof.

The blend ratio between (C) and (D) is preferably within a range of 1:50 to 50:1, more preferably 1:30 to 30:1, and yet more preferably 1:20 to 20:1. When (C) and (D) are used in this range of the blend ratio, the planarity is improved.

(E) N-Substituted Imidazole

The N-substituted imidazole is required to remedy the residual copper and to inhibit corrosion. The usable N-substituted imidazole can include N-substituted imidazoles represented by the following general formula (I).

[Chemical 2]

(1)

(In the formula (I), Ra, Rb, and Rc represent H or an alkyl group of 1 to 4 carbon atoms, and Rd represents a group selected from the group consisting of a benzyl group, a vinyl group, an alkyl group of 1 to 4 carbon atoms, and a group in which a portion of H of these groups has been substituted with OH or $NH_2$.)

Among the N-substituted imidazoles represented by the above general formula (1), the polishing composition particularly preferably comprises any one type or more selected from N-vinylimidazole, N-methylimidazole, N-ethylimidazole, N-benzylimidazole, 1,2-dimethylimidazole, N-butylimidazole, and N-(3-aminopropyl)-imidazole. The use of such a composition will provide less residual copper, less corrosion, and less influences on the polishing speed and the planarity.

The concentration of the N-substituted imidazole is preferably 0.005 to 3 mass %, more preferably 0.005 to 0.5 mass %, and yet more preferably 0.005 to 0.3 mass %, based on the total polishing composition, in order to effectively reduce the residual copper. If the concentration of the N-substituted imidazole is lower than 0.005 mass %, the effect of addition of the N-substituted imidazole may not be sufficiently obtained and the residual copper or corrosion may not be sufficiently suppressed. On the other hand, if the concentration of the N-substituted imidazole is higher than 3 mass %, the polishing speed and the planarity may be lowered.

(F) Abrasive

The polishing composition of the present embodiment may contain an abrasive for the purpose of improving the polishing speed of the wiring metal, and the purpose of further reducing residual copper on the interlayer insulating film or the barrier film.

Examples of such an abrasive include silica, alumina, ceria, and organic abrasives. Among these, it is preferable to use a silica capable of sufficiently increasing the polishing speed and capable of reducing the occurrence of damage. Furthermore, as the silica, it is more preferable to use a silica comprising, as a main component, colloidal silica formed by hydrolysis from alkoxysilane or soluble glass. The polishing composition may comprise any one type, or a mixture of two or more types, of the abovementioned abrasives.

The particle diameter of the abrasive is preferably 1 μm or less, and more preferably 0.01 to 0.5 μm. If the particle diameter is smaller than the above range, the polishing speed may not be sufficiently increased. On the other hand, if the particle diameter is larger than the above range, the abrasive may serve as a causative factor of the occurrence of damage such as scratches on the surface of copper or copper alloy.

The concentration of the abrasive is preferably 30 mass % or less, more preferably 0.01 to 10 mass %, yet more preferably 0.05 to 5 mass %, and most preferably 0.1 to 2 mass %, based on the total polishing composition. If the concentration of the abrasive is higher than the above range, the abrasive may serve as a causative factor of dishing or scratches.

(G) Nonionic Water-Soluble Polymer

The polishing composition of the present embodiment is preferably subjected to addition of a nonionic water-soluble polymer so as to inhibit minute corrosion on the surface of copper or copper alloy that cannot be sufficiently inhibited by (C) and (D).

Examples of the nonionic water-soluble polymer include polyvinyl alcohol, a vinylpyrrolidone (co)polymer, an acryloylmorpholine (co)polymer, and an N-isopropylacrylamide (co)polymer. Moreover, the polishing composition may comprise any one type, or a mixture of two or more types, of the abovementioned nonionic water-soluble polymers.

Moreover, the molecular weight of the nonionic water-soluble polymer is preferably 3,000 to 1,500,000, and more preferably 3,000 to 1,000,000, in terms of the weight average molecular weight. Furthermore, since some nonionic water-soluble polymers become cationic in a strongly acidic solution having a pH of 1 or lower, the pH of the polishing composition may have to be higher than the pH of such polymers, and is preferably 5 to 11, more preferably 7 to 11, and yet more preferably 8 to 11.

In addition, as the nonionic water-soluble polymer, it is preferable to use a hydrophilic polymer whose solubility in water at 25° C. is 5 mass % or more. The hydrophilic group of the nonionic water-soluble polymer is preferably an alcoholic hydroxyl group or an amide group, and more preferably an alcoholic hydroxyl group, a cyclic amide group, or an N-alkyl-substituted amide group.

Such a nonionic water-soluble polymer can be obtained, for example, by polymerizing monomers having a nonionic hydrophilic group and a vinyl group. Examples of such a monomer can include acrylamide, N-vinylacetamide, dimethylacrylamide, N-isopropylacrylamide, vinylpyrrolidone, vinylcaprolactam, acryloylmorpholine, and diacetone acrylamide. Moreover, the nonionic water-soluble polymer may be either a homopolymer or a copolymer of these monomers. Furthermore, the polymer may be introduced with a hydroxyl group through a polymer reaction. Examples of the resultant product can include polyvinyl alcohol obtained through saponification of vinyl acetate polymers.

Moreover, the nonionic water-soluble polymer may be in the form of a copolymer of hydrophobic monomers as long as the solubility in water at 25° C. is 5 mass % or more. Examples of such a hydrophobic monomer can include styrene and N-t-octylacrylamide.

Furthermore, water-soluble polymers having an anionic group such as polyacrylic acid are not preferred since corrosion may not be sufficiently inhibited. Moreover, water-soluble polymers having a cationic group such as polyethyleneimine are not preferred since the stability of the polishing composition is easily impaired when silica is used as abrasive grains. However, as long as the desired performance is not impaired, these monomers having an anionic group and monomers having a cationic group may be used by copolymerizing with the abovementioned monomers having a nonionic water-soluble group.

Examples of the monomers having an anionic group used herein can include acrylic acid, methacrylic acid, maleic acid, and itaconic acid, and a salt thereof. On the other hand, examples of the monomers having a cationic group can include allylamine, N, N-dimethylaminopropylacrylamide, and N-vinylimidazole, and a salt thereof. The salt mentioned herein includes a quaternary salt.

Moreover, the content of the repeat unit derived from a monomer having an anionic group, or the repeat unit derived a monomer having a cationic group, based on the polymer, differs according to the amount of the added polymer into the polishing composition and thus is difficult to equally specify here; however, it is normally 10 mass % or less, and preferably 5 mass % or less. By introducing such an anionic group or a cationic group, the water solubility of the polymer can be improved.

More preferably, the abovementioned monomers having a nonionic water-soluble group, hydrophobic monomers, monomers having an anionic group, and monomers having a cationic group do not have an ester linkage. This is because the resultant polymer is to be added to an aqueous polishing composition for use, and thus those having an ester linkage susceptible to hydrolysis may impair the stability.

The polymerization may be performed by employing a publicly known method, although radical polymerization in an aqueous solution or an organic solvent is convenient. This is a method in which monomers are dissolved in a solvent and polymerized by using a radical initiator such as azobisisobutyronitrile. At this time, the molecular weight can also be adjusted by using a chain transfer agent such as dodecylmercaptan, trimethylolpropane tris(3-mercaptopropionate), and α-methylstyrene dimer.

The concentration of the nonionic water-soluble polymer is preferably 0.7 mass % or less, more preferably 0.01 to 0.5 mass %, and yet more preferably 0.01 to 0.3 mass %, based on the total polishing composition. If the concentration of the nonionic water-soluble polymer is lower than the above range, the effect of the corrosion inhibition is lowered. On the other hand, if there is too much nonionic water-soluble polymer, it may be necessary to consider the increase in viscosity and lowering in the stability when a polishing liquid is used.

Unlike benzotriazole-based compounds such as benzotriazole, the nonionic water-soluble polymer has less effect on the reduction in the polishing speed.

(H) Ammonia

The polishing composition of the present embodiment may contain ammonia to an extent not to negatively affect the performance and physical properties.

The ammonia is used for the purpose of maintaining the stable polishing performance, and/or as a pH adjuster or a buffer. The concentration of the ammonia is preferably 1 mass % or less, more preferably 0.1 to 0.7 mass % or less, and yet more preferably 0.1 to 0.5 mass % or less, based on the total polishing composition.

(I) Anticorrosion Agent

The polishing composition of the present embodiment may contain an anticorrosion agent so as to further reduce the corrosion on the surface of the wiring metal.

Examples of such an anticorrosion agent may include azoles such as benzimidazole-2-thiol, 2[2-(benzothiazolyl)]thiopropionic acid, 2-[2-(benzothiazolyl)]thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-methoxycarbonyl-1H-benzotriazole, 4-butoxycarbonyl-1H-benzotriazole, 4-octyloxycarbonyl-1H-benzotriazole, 5-hexylbenzotriazole, N-(1,2,3-benzotriazolyl-1-methyl)-N-(1,2,4-triazolyl-1-methyl)-2-ethylhexylamine, tolyltriazole, naphthotriazole, bis[(1-benzotriazolyl)methyl]phosphonic acid, benzimidazole, and tetrazole, and a salt thereof. Among these, benzotriazole, tolyltriazole, hydroxybenzotriazole, carboxybenzotriazole, benzimidazole, tetrazole, or quinaldinic acid is preferably used.

Since these anticorrosion agents have an ability to remarkably lower the polishing speed of the wiring metal, the content thereof is preferably the necessary minimum. Specifically, the concentration of such an anticorrosion agent is preferably 0.1 mass % or less, more preferably 0.05 mass % or less, and yet more preferably 0.02 mass % or less, based on the total polishing composition.

(pH)

The polishing composition of the present invention is preferable used within a range of pH of 8 to 11. As a reagent for adjusting the pH, the abovementioned inorganic acids, organic acids, alkalis, and the like can be used.

If the pH of the polishing composition is below the above range, abrasive grains are apt to aggregate, which readily causes corrosion on the surface of the wiring metal. Moreover, if the pH exceeds the above range, the interlayer insulating film may be deteriorated.

(Polishing Method)

Next, the polishing method of the present invention is described. In the present embodiment, as an example of the polishing method of the present invention, a method for polishing a metal film by a CMP method which is performed for forming a metal wiring through the damascene method to produce a semiconductor device is exemplified for description.

Figure 1:
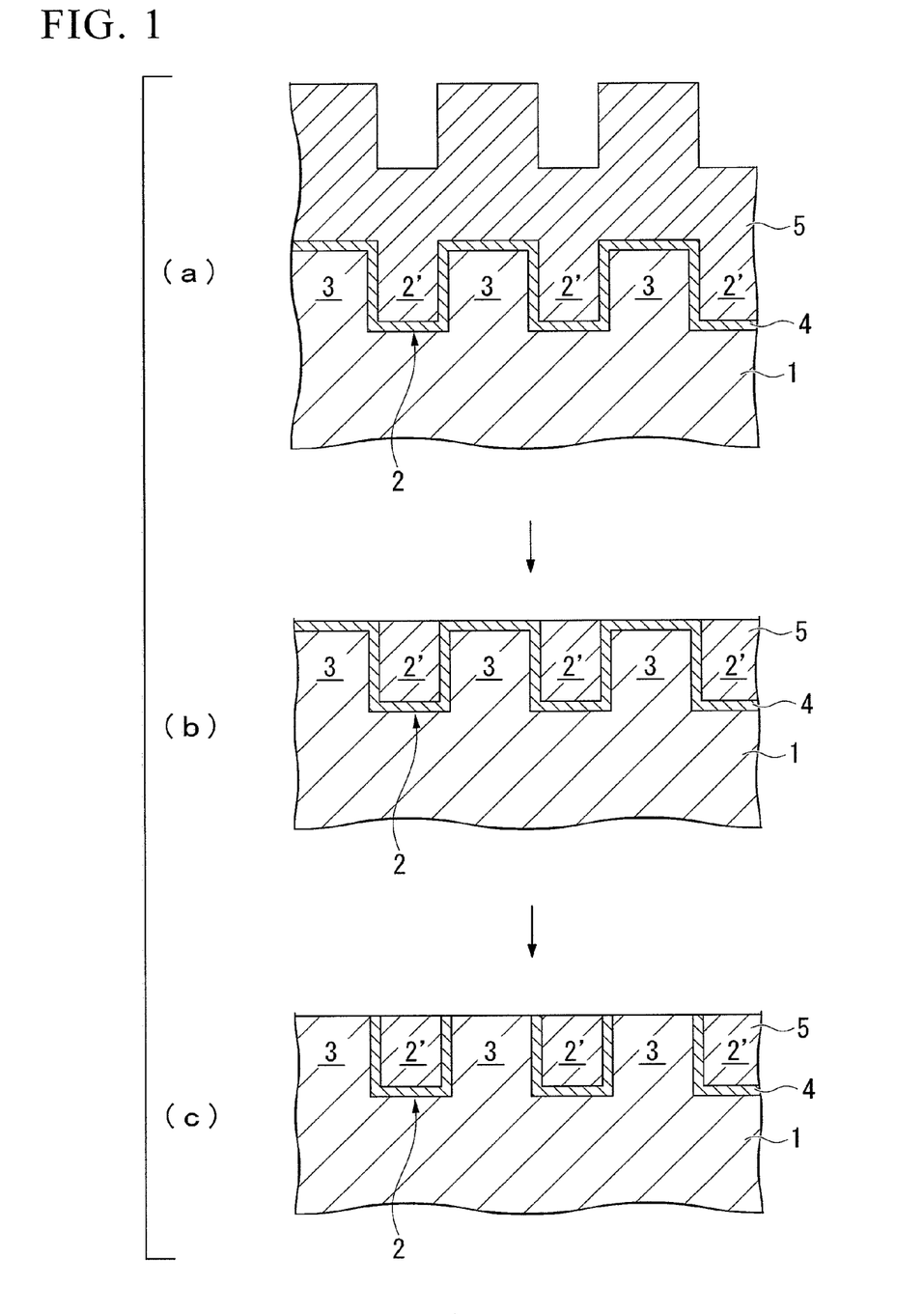
FIG. 1 is a transverse cross-sectional view explaining a method for forming a metal wiring with the use of the damascene method.

FIG. 1 is a transverse cross-sectional view for explaining a method for forming a metal wiring with the use of the damascene method, when a barrier metal film has been formed. In order to form a metal wiring with the use of the damascene method, firstly, as shown in FIG. 1(a), an interlayer insulating film (insulating layer) 1 for constituting a semiconductor substrate is provided. Examples of the interlayer insulating film 1 can include a silicon oxide film, inorganic interlayer insulating films containing a large amount of silicon such as hydrogen silsesquioxane (HSQ) and methyl silsesquioxane (MSQ), and organic interlayer insulating films such as a film comprising benzocyclobutene. Moreover, interlayer insulating films of low dielectric constant in which pores are provided in these interlayer insulating films may also be used.

Next, as shown in FIG. 1(a), the interlayer insulating film 1 is provided with grooves (concave portions) 2 for forming the wiring 2'. Then, on the interlayer insulating film 1 having the grooves 2 is formed a barrier metal film 4. For the barrier metal film 4, there may be used, for example, nickel, tantalum, titanium, and platinum group metals such as ruthenium and platinum, and an alloy thereof. Among these, tantalum and tantalum nitride are preferably used.

Subsequently, using a film forming method such as plating, on the barrier metal film 4 is formed a metal film 5 comprising copper or copper alloy to serve as the wiring, and the metal film 5 is embedded so as to cover the grooves 2. At this time, since the metal film 5 cannot be formed exclusively in the grooves 2, the state becomes such that, as shown in FIG. 1(a), the metal film 5 is formed all over the surface of the interlayer insulating film 1 which includes spaces 3 between grooves 2.

Next, using the polishing composition of the present invention, the metal film 5 is polished to thereby remove the excessive metal film 5 on the barrier metal film 4. Here, the polishing procedure is performed by, for example, a method of pressing a polishing cloth against the semiconductor substrate provided with the metal film 5 and relatively moving a polishing platen and the semiconductor substrate in inplane directions while supplying the polishing composition onto the polishing cloth of the polishing platen. In the polishing method of the present embodiment, a general polishing machine equipped with a holder for holding the semiconductor substrate and a polishing platen having a polishing cloth attached thereon, or the like, may be used as the polishing machine. Moreover, a general nonwoven fabric or polyurethane foam, or the like, may be used as the polishing cloth.

The rotation speed of the polishing platen differs according to the structure and the size of the polishing machine. However, if a general polishing machine is employed, the rotation speed is preferably set at 10 to 500 m/min, more preferably 20 to 300 m/min, and yet more preferably 30 to 150 m/min. The semiconductor substrate is preferably rotated together with the polishing platen so as to keep the uniformity of polishing. The rotation frequency of the semiconductor substrate may be set to approximately the same as that of the polishing platen. However, for achieving the uniformity, the rotation frequency of the polishing platen may be decreased or increased with respect to the rotation frequency of the semiconductor substrate.

Moreover, for performing the polishing procedure, the semiconductor substrate is pressed against the polishing cloth by applying a pressure through the holder. The pressure for pressing the semiconductor substrate against the polishing cloth may be set at 0.1 to 100 KPa, more preferably 0.6 to 35 KPa, and yet more preferably 0.6 to 20 KPa.

The polishing composition of the present invention is preferably supplied to the polishing machine at a constant temperature, for keeping the polishing speed stable. However, the temperature of the polishing composition of the present invention may be adjusted for the purpose of controlling the polishing speed, or the like. In this case, the temperature of the polishing composition is preferably set within a range of 0 to 100° C., more preferably 10 to 50° C., and yet more preferably 15 to 40° C. If the temperature of the polishing composition is too low, a sufficiently high polishing speed may not be obtained. Moreover, if the temperature of the polishing composition is lower than 0° C., the polishing composition may be frozen. Furthermore, if the temperature of the polishing composition is too high, unfavorable side reactions may occur.

The amount (dripping amount) of the polishing composition of the present invention to be supplied to the semiconductor substrate that has been provided with the metal film serving as the polishing target can be appropriately determined in accordance with the size of the semiconductor substrate and the like. For example, if an 8-inch wafer (200-mm wafer) is used as the semiconductor substrate, the polishing composition may be used at 10 to 1,000 ml/min, preferably 50 to 500 ml/min, and yet more preferably 50 to 300 ml/min. The dripping amount of the polishing composition may be appropriately changed during the polishing procedure.

The method for supplying the polishing composition of the present invention onto the polishing cloth is not specifically limited, although there may be employed a method of continuously supplying with a pump or the like. At this time, the polishing composition may be supplied as a single solution containing all components; however, in consideration of stability of the solution, the composition may also be supplied as a plurality of compositions separately divided. Specifically for example, the supplying procedure can be performed in a divided manner having three types of compositions: one comprising an abrasive as a main component; one comprising an oxidizing agent; and one comprising the other components, or in a divided manner having two types of compositions: one comprising an abrasive as a main component; and one comprising the other components. Moreover, if the polishing composition is supplied in such a divided manner having a plurality of types of compositions, the plurality of types of compositions may be separately supplied onto the polishing cloth from separate solution supplying lines, although the plurality of types of compositions may also be mixed immediately before being supplied onto the polishing cloth to be supplied as a single solution. If the plurality of types of compositions are mixed immediately before being supplied onto the polishing cloth, there may be employed, for example: a supplying device in which solution supplying lines are respectively provided corresponding to the plurality of types of compositions, and all of these solution supplying lines are joined together in the vicinity of an outlet, so as to form the polishing composition containing all components by mixing the plurality of types of compositions in the vicinity of the outlet; or a supplying device which has a temporary tank for mixing the plurality of types of compositions, or the like. Moreover, if the plurality of types of compositions are separately supplied onto the polishing cloth by using such separate solution supplying lines that have been respectively provided corresponding to the plurality of types of compositions, the flow rates of these respective compositions may be appropriately modified during the polishing procedure.

By performing the polishing method of the present embodiment in such a manner, the excessive metal film 5 on the barrier metal film 4 is removed to expose the barrier metal film 4 provided on the spaces 3 between the grooves 2 as shown in FIG. 1(b). By so doing, the surface of the interlayer insulating film 1 is planarized, as shown in FIG. 1(b).

Then, the excessive barrier metal film 4 on the semiconductor substrate is removed using the CMP method to expose the surface of the interlayer insulating film 1, as shown in FIG. 1(c). By so doing, the wiring 2' comprising copper or copper alloy which is embedded in the grooves 2 can be formed.

Since the polishing composition of the present embodiment comprises an oxidizing agent (A); at least one acids (B) selected from amino acids, carboxylic acids of 8 or less carbon atoms, or inorganic acids; a sulfonic acid (C) having an alkyl group of 8 or more carbon atoms; a fatty acid (D) having an alkyl group of 8 or more carbon atoms; and an N-substituted imidazole (E) mentioned above, then there can be provided a polishing composition with which damage and corrosion hardly occur on the surface of the wiring metal, residual copper hardly remains on the barrier film, a sufficient polishing speed can be maintained, dishing and erosion can be prevented, and high planarity can be provided.

Moreover, in the polishing method of the present embodiment, the metal film 5 comprising copper or copper alloy embedded on the interlayer insulating film 1 which has the grooves 2 and is provided on the semiconductor substrate, so as to cover the grooves 2, is polished by using the polishing composition of the present invention. Therefore, damage and corrosion hardly occur on the surface of the wiring 2', residual copper hardly remains on the barrier metal film 4, a sufficient polishing speed can be maintained, dishing and erosion can be prevented, and high planarity can be provided.

In the abovementioned embodiment, the description has been made by exemplifying the case for polishing the metal film embedded on the insulating layer through the barrier metal film. However, the present invention is not limited to the above embodiment. For example, the present invention can also be suitably used for cases of polishing a metal film comprising copper or copper alloy which is embedded on a insulating layer having concave portions, so as to cover the concave portions.

<Composition and Kit Comprising a Plurality of Types of Compositions for Forming the Polishing Composition>

Considering the handling convenience such as solution stability, the polishing composition of the present invention may be divided into a plurality of types of compositions and stored for transportation or storage. In cases where a composition is divided into a plurality of types of compositions, for example, the polishing composition can be divided into two types of compositions: one comprising an oxidizing agent; and one comprising the other components. Furthermore, there are cases where a polishing composition containing abrasive grains as the abrasive can be divided into a plurality of types of compositions, for example, the polishing composition may be divided into three types of compositions: one comprising the abrasive as a main component; one comprising an oxidizing agent; and one comprising the other components.

Moreover, considering the handling convenience such as solution stability, the polishing composition of the present invention, or a plurality of types of compositions to form the polishing composition of the present invention, may be stored as a composition or compositions which are thicker during transportation or storage than in use, so as to be diluted with water or the like to a concentration suitable for polishing when used. For example, a composition which is 2 to 5-times thicker than in use can be prepared as such a thick composition.

A kit comprising such a plurality of types of compositions forms the polishing composition of the present invention by mixing the abovementioned plurality of types of compositions, with or without dilution with water.

A composition, and a kit comprising a plurality of types of compositions, which forms the polishing composition of the present invention, have excellent solution stability and handling convenience during transportation or storage, and are capable of readily forming the polishing composition of the present invention when needed.

EXAMPLES

As below, the present invention is described in more detail with reference to Examples, but the present invention is not to be limited by these Examples.

Examples 1 to 25 and Comparative Examples 1 to 13

Polishing compositions of Examples 1 to 25 and Comparative Examples 1 to 13 shown in Table 1 to Table 5 were prepared, and were subjected to pH measurement. The results are shown in Table 1 to Table 5. Moreover, the polishing compositions of Examples 1 to 25 and Comparative Examples 1 to 13 were used to polish a metal film serving as the polishing target as shown below, followed by evaluations regarding the polishing speed, residual copper (Cu), dishing, erosion, surface damage, and corrosion as shown below. The results are shown in Table 1 to Table 5.

TABLE 1

|  | Example 1 | Example 2 | Example 3 | Example 4 | Example 5 | Example 6 | Example 7 | Example 8 | Example 9 |
|---|---|---|---|---|---|---|---|---|---|
| Ammonium persulfate | 1.5 | 1.5 | 1.5 | 1.5 | 1.5 | 1.5 | 1.5 | 1.5 | 1.5 |
| Oxalic acid dihydrate | 0.7 | 0.7 | 0.7 | 0.7 | 0.7 | 0.7 | 0.7 | 0.7 | 0.7 |
| Dodecylbenzene-sulfonic acid | 0.07 | 0.07 | 0.07 | 0.07 | 0.07 | 0.07 | 0.07 | 0.07 | 0.07 |
| Oleic acid | 0.015 | 0.015 | 0.015 | 0.015 | 0.015 | 0.015 | 0.015 | 0.015 | 0.01 |
| Lauric acid |  |  |  |  |  |  |  |  |  |
| Type of imidazole added | N-vinyl-imidazole | N-methyl-imidazole | N-methyl-imidazole | N-ethyl-imidazole | N-ethyl-imidazole | N-benzyl-imidazole | 1,2-dimethyl-imidazole | N-butyl-imidazole | N-(3-aminopropyl)-1H-imidazole |
| Dose of imidazole | 0.075 | 0.05 | 0.075 | 0.05 | 0.075 | 0.075 | 0.075 | 0.075 | 0.025 |
| Colloidal silica (average particle diameter = about 70 nm) | 0.5 | 0.5 | 0.5 | 0.5 | 0.5 | 0.5 | 0.5 | 0.5 |  |
| Colloidal silica (average particle diameter = about 120 nm) |  |  |  |  |  |  |  |  | 1.5 |
| Polyvinyl-pyrrolidone (molecular weight = about 10,000) | 0.1 | 0.1 | 0.1 | 0.1 | 0.1 | 0.1 | 0.1 | 0.1 |  |
| Polyvinyl-pyrrolidone |  |  |  |  |  |  |  |  | 0.05 |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| (molecular weight = about 1,000,000) |  |  |  |  |  |  |  |  |  |
| Ammonia | 0.32 | 0.32 | 0.32 | 0.32 | 0.32 | 0.32 | 0.32 | 0.32 | 0.32 |
| Benzoimidazole | 0.007 | 0.007 | 0.007 | 0.007 | 0.007 | 0.007 | 0.007 | 0.007 | 0.005 |
| pH | 9.14 | 9.29 | 9.3 | 9.29 | 9.31 | 9.2 | 9.44 | 9.21 | 9.14 |
| Polishing speed (Å/min) | 5192 | 4970 | 4840 | 5090 | 4860 | 5156 | 6471 | 5323 | 5932 |
| Residual Cu | 3.75 | 3.75 | 3.75 | 3.75 | 3.75 | 3.75 | 3.75 | 3.75 | 3.25 |
| Dishing (nm) | 57 | 83 | 95 | 62 | 83 | 50 | 36 | 53 | 37.3 |
| Erosion (nm) | 5 | 6 | 6 | 8 | 9 | 13 | 5 | 14 | 37.1 |
| Surface damage | A | A | A | A | A | B | B | A | A |
| Corrosion evaluation | A | A | A | A | A | B | B | A | A |

TABLE 2

|  | Example 10 | Example 11 | Example 12 | Example 13 | Example 14 | Example 15 | Example 17 | Example 18 |
|---|---|---|---|---|---|---|---|---|
| Ammonium persulfate | 1.5 | 1.5 | 1.5 | 1.5 | 1.5 | 1.5 | 1.5 | 1.5 |
| Oxalic acid dihydrate | 0.7 | 0.7 | 0.7 | 0.7 | 0.7 | 0.7 | 0.7 | 0.7 |
| Dodecylbenzenesulfonic acid | 0.07 | 0.07 | 0.07 | 0.07 | 0.07 | 0.07 | 0.07 | 0.07 |
| Oleic acid | 0.015 | 0.015 | 0.01 | 0.01 | 0.005 | 0.07 | 0.07 | 0.07 |
| Lauric acid |  |  |  |  |  |  |  |  |
| Type of imidazole added | N-vinyl-imidazole | N-vinyl-imidazole | N-vinyl-imidazole | N-vinyl-imidazole | N-vinyl-imidazole | N-vinyl-imidazole | N-vinyl-imidazole | N-vinyl-imidazole |
| Dose of imidazole | 0.1 | 0.15 | 0.3 | 0.075 | 0.075 | 0.075 | 0.1 | 0.15 |
| Colloidal silica (average particle diameter = about 70 nm) | 0.5 | 0.5 |  |  | 0.5 | 0.5 | 0.5 | 0.5 |
| Colloidal silica (average particle diameter = about 120 nm) |  |  | 1.5 | 1.5 |  |  |  |  |
| Polyvinylpyrrolidone (molecular weight = about 10,000) | 0.1 | 0.1 |  |  | 0.1 | 0.1 | 0.1 | 0.1 |
| Polyvinylpyrrolidone (molecular weight = about 1,000,000) |  |  | 0.05 | 0.05 |  |  |  |  |
| Ammonia | 0.32 | 0.32 | 0.32 | 0.32 | 0.32 | 0.32 | 0.32 | 0.32 |
| Benzoimidazole | 0.007 | 0.007 | 0.005 | 0.005 | 0.007 | 0.007 | 0.007 | 0.007 |
| pH | 9.33 | 9.31 | 9.11 | 9.23 | 9.18 | 9.38 | 9.38 | 9.36 |
| Polishing speed (Å/min) | 4912 | 4954 | 5018 | 6315 | 4776 | 5720 | 5516 | 5461 |
| Residual Cu | 3.5 | 3.5 | 3.75 | 3 | 3.5 | 2 | 3.5 | 3.5 |
| Dishing (nm) | 62.6 | 66.2 | 48.7 | 71.7 | 61.1 | 77.2 | 78.9 | 78.2 |
| Erosion (nm) | 9.2 | 13.2 | 45 | 34.1 | 6.5 | 9.2 | 10 | 13.2 |
| Surface damage | A | A | A | A | B | A | A | B |
| Corrosion evaluation | A | A | A | A | B | B | B | A |

TABLE 3

|  | Example 19 | Example 20 | Example 21 | Example 22 | Example 23 | Example 24 | Example 25 | Example 16 |
|---|---|---|---|---|---|---|---|---|
| Ammonium persulfate | 1.5 | 1.5 | 1.5 | 1.5 | 1.5 | 1.5 | 1.5 | 1.5 |
| Oxalic acid dihydrate | 0.7 | 0.7 | 0.7 | 0.7 | 0.7 | 0.7 | 0.7 | 0.7 |
| Dodecylbenzenesulfonic acid | 0.07 | 0.07 | 0.07 | 0.07 | 0.07 | 0.07 | 0.07 | 0.07 |
| Oleic acid | 0.015 | 0.015 | 0.015 | 0.015 | 0.03 | 0.015 |  | 0.1 |
| Lauric acid |  |  |  |  |  |  | 0.01 |  |
| Type of imidazole added | N-vinyl-imidazole | N-vinyl-imidazole | N-vinyl-imidazole | N-vinyl-imidazole | N-vinyl-imidazole | N-vinyl-imidazole | N-vinyl-imidazole | N-vinyl-imidazole |
| Dose of imidazole | 0.075 | 0.05 | 0.05 | 0.025 | 0.05 | 0.075 | 0.025 | 0.075 |
| Colloidal silica (average particle diameter = about 70 nm) | 1 | 1 | 1.5 | 1.5 | 1 | 0.5 |  |  |

TABLE 3-continued

|  | Example 19 | Example 20 | Example 21 | Example 22 | Example 23 | Example 24 | Example 25 | Example 16 |
|---|---|---|---|---|---|---|---|---|
| Colloidal silica (average particle diameter = about 120 nm) |  |  |  |  |  |  | 0.2 | 1.5 |
| Polyvinylpyrrolidone (molecular weight = about 10,000) | 0.18 | 0.18 | 0.26 | 0.26 | 0.18 | 0.1 | 0.1 |  |
| Polyvinylpyrrolidone (molecular weight = about 1,000,000) |  |  |  |  |  |  |  | 0.03 |
| Ammonia | 0.32 | 0.32 | 0.32 | 0.32 | 0.32 | 0.4 | 0.4 | 0.32 |
| Benzoimidazole | 0.007 | 0.007 | 0.007 | 0.007 | 0.007 | 0.007 | 0.007 | 0.005 |
| pH | 9.25 | 9.23 | 8.81 | 8.88 | 9.24 | 9.47 | 9.39 | 9.17 |
| Polishing speed (Å/min) | 5098 | 5437 | 3800 | 4249 | 5492 | 6736 | 6323 | 5341 |
| Residual Cu | 3.5 | 3.5 | 3.5 | 3.75 | 3.5 | 2.5 | 2.75 | 3.5 |
| Dishing (nm) | 88.9 | 77 | 64 | 62.2 | 65.7 | 61 | 72 | 29 |
| Erosion (nm) | 15.5 | 11.9 | 11 | 15 | 13.2 | 4 | 21 | 19.9 |
| Surface damage | A | B | A | A | B | A | A | A |
| Corrosion evaluation | A | A | A | A | A | A | A | B |

TABLE 4

|  | Com. Example 1 | Com. Example 2 | Com. Example 3 | Com. Example 4 | Com. Example 5 | Com. Example 6 | Com. Example 7 | Com. Example 8 | Com. Example 9 |
|---|---|---|---|---|---|---|---|---|---|
| Ammonium persulfate | 1.5 | 1.5 | 1.5 | 1.5 | 1.5 | 1.5 | 1.5 | 1.5 | 1.5 |
| Oxalic acid dihydrate | 0.7 | 0.7 | 0.7 | 0.7 | 0.7 | 0.7 | 0.7 | 0.7 | 0.7 |
| Dodecylbenzenesulfonic acid | 0.07 | 0.07 | 0.07 | 0.07 | 0.07 | 0.07 | 0.07 | 0.07 | 0.07 |
| Oleic acid | 0.1 | 0.015 | 0.01 | 0.015 | 0.01 | 0.01 | 0.015 | 0.015 | 0.015 |
| Lauric acid |  |  |  |  |  |  |  |  |  |
| Type of imidazole added | Not added | Not added | Not added | Not added | 4-imidazole-carboxylic acid | Urocanic acid | 2-ethyl-imidazole | 4-phenyl-imidazole | 4-phenyl-imidazole |
| Dose of imidazole |  |  |  |  | 0.025 | 0.025 | 0.05 | 0.01 | 0.025 |
| Colloidal silica (average particle diameter = about 70 nm) |  | 0.5 |  | 1.5 |  |  | 0.5 |  |  |
| Colloidal silica (average particle diameter = about 120 nm) | 1.5 |  | 1.5 |  | 1.5 | 1.5 |  | 1.5 | 1.5 |
| Polyvinylpyrrolidone (molecular weight = about 10,000) |  | 0.1 |  | 0.26 |  |  | 0.1 |  |  |
| Polyvinylpyrrolidone (molecular weight = about 1,000,000) | 0.03 |  | 0.05 |  | 0.05 | 0.05 |  | 0.05 | 0.05 |
| Ammonia | 0.32 | 0.32 | 0.32 | 0.32 | 0.32 | 0.32 | 0.32 | 0.32 | 0.32 |
| Benzoimidazole | 0.005 | 0.007 | 0.005 | 0.007 | 0.005 | 0.005 | 0.007 | 0.005 | 0.005 |
| pH | 8.97 | 9.29 | 9.22 | 8.94 | 9.09 | 9.01 | 9.27 | 9.3 | 9.31 |
| Polishing speed (Å/min) | 5590 | 5457 | 6776 | 4350 | 6417 | 5678 | 5070 | 5170 | 6560 |
| Residual Cu | 4.25 | 5.25 | 4.75 | 5 | 5 | 5 | 5 | 4.5 | 4.25 |
| Dishing (nm) | 28 | 26 | 20.6 | 30 | 36 | 1.6 | 29 | 70 | 106 |
| Erosion (nm) | 24 | 5.3 | 30 | 10 | 14 | 10.8 | 7 | 30 | 108 |
| Surface damage | B | B | B | A | B | B | B | B | B |
| Corrosion evaluation | F | A | A | B | A | A | B | A | A |

TABLE 5

|  | Com. Example 10 | Com. Example 11 | Com. Example 12 | Com. Example 13 |
|---|---|---|---|---|
| Ammonium persulfate | 1.5 | 1.5 | 1.5 | 1.5 |
| Oxalic acid dihydrate | 0.7 | 0.7 | 0.7 | 0.7 |
| Dodecylbenzenesulfonic acid | 0.07 | 0.07 | 0.07 | 0.07 |
| Oleic acid | 0.015 | 0.015 | 0.015 | 0.015 |
| Lauric acid |  |  |  |  |
| Type of imidazole added | 2-isopropyl-imidazole | 2-isopropyl-imidazole | Imidazole | Imidazole |

TABLE 5-continued

|  | Com. Example 10 | Com. Example 11 | Com. Example 12 | Com. Example 13 |
|---|---|---|---|---|
| Dose of imidazole | 0.025 | 0.075 | 0.025 | 0.075 |
| Colloidal silica (average particle diameter = about 70 nm) |  |  |  |  |
| Colloidal silica (average particle diameter = about 120 nm) | 1.5 | 1.5 | 1.5 | 1.5 |
| Polyvinylpyrrolidone (molecular weight = about 10,000) |  |  |  |  |
| Polyvinylpyrrolidone (molecular weight = about 1,000,000) | 0.05 | 0.05 | 0.05 | 0.05 |
| Ammonia | 0.32 | 0.32 | 0.32 | 0.32 |
| Benzoimidazole | 0.005 | 0.005 | 0.005 | 0.005 |
| pH | 9.28 | 9.27 | 9.3 | 9.32 |
| Polishing speed (Å/min) | 5380 | 5200 | 7140 | 7560 |
| Residual Cu | 5.75 | 6 | 5 | 5.25 |
| Dishing (nm) | 19 | 18 | 52 | 69 |
| Erosion (nm) | 12 | 13 | 25 | 42 |
| Surface damage | B | B | B | B |
| Corrosion evaluation | A | A | A | A |

In Table 1 to Table 5, the amounts of each component are indicated by mass %. Moreover, the rest other than the components shown in Table 1 to Table 5 was water. As shown in Table 1 to Table 5, the polishing compositions of Examples 1 to 25 and Comparative Examples 1 to 13 used ammonium persulfate as the oxidizing agent (A); oxalic acid dihydrate as the at least one acids (B) selected from amino acids, carboxylic acids of 8 or less carbon atoms, or inorganic acids; alkylbenzene sulfonic acid as the sulfonic acid (C) having an alkyl group of 8 or more carbon atoms; oleic acid or lauric acid as the fatty acid (D) having an alkyl group of 8 or more carbon atoms; those shown in Table 1 to Table 5 as the imidazole (E); two types of colloidal silicas having different average particle diameters as the abrasive (F); two types of polyvinylpyrrolidones having different molecular weights as the nonionic water-soluble polymer (G); and benzoimidazole as the anti-corrosion agent (I).

Moreover, for polishing a polishing target metal film by using the polishing compositions of Examples 1 to 25 and Comparative Examples 1 to 13, the metal film 5 prepared by the following manner was employed as the polishing target metal film. On an 8-inch (200 mm) silicon wafer substrate comprising an interlayer insulating film 1 of silicon dioxide which had been formed with grooves 2 (concave portions) in a depth of 500 nm, the metal film 5 comprising a copper film having a thickness of 1100 nm was embedded so as to cover the concave portions through a barrier metal film 4 comprising a tantalum film having a thickness of 25 nm. The thickness of the copper film and the tantalum film was measured based on the sheet resistance.

Moreover, the polishing machine used was SH-24 manufactured by SpeedFam Co., Ltd. The polishing procedure was stopped on completion of 30 seconds overpolishing beyond an endpoint at which torque nonuniformity had started. Furthermore, the polishing procedure was performed under conditions where the relative speed between the substrate and the polishing platen (rotation speed of the polishing platen) was 70 m/min, the supply rate of the polishing composition (dripping amount) was 150 ml/min, and the pressure of the substrate against the polishing cloth was 15 kPa, at room temperature. The polishing pad used was IC1400 (k groove) produced by Nitta Haas Inc.

"Polishing Speed"

The polishing speed was calculated from the polishing time and the thickness of the copper film (metal film 5) and the barrier metal film 4 that had been measured based on the electric resistance values before and after polishing.

"Residual Copper (Cu)"

The surface of the polished barrier metal film 4 was observed using an optical microscope. Then, a relative evaluation was performed according to the size of residual copper, on a six-point rating scale with 0.25 increments in which a state having no residual copper was rated 1 and a state having residual copper all over the surface was rated 6. Those rated 4 or less in the residual copper evaluation are usable.

"Dishing"

Figure 2:
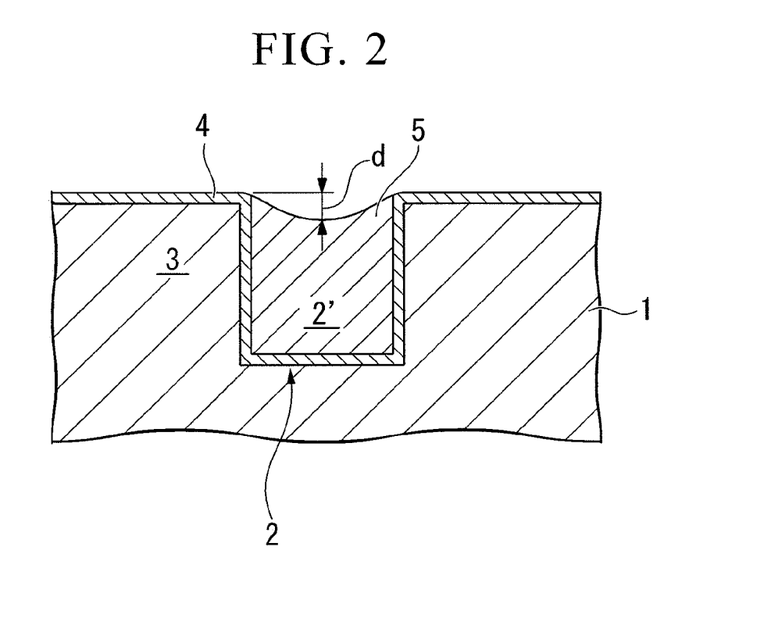
FIG. 2 is a transverse cross-sectional view explaining a dishing phenomenon.

The depression generated in the copper pattern of line/space of 100 μm/100 μm (d shown of FIG. 2) was evaluated as dishing. A contact-type profiler was used for the measurement of depression. In FIG. 2, the same reference symbols are used for the same members as those shown in FIG. 1, and description thereof is omitted.

"Erosion"

Figure 3:
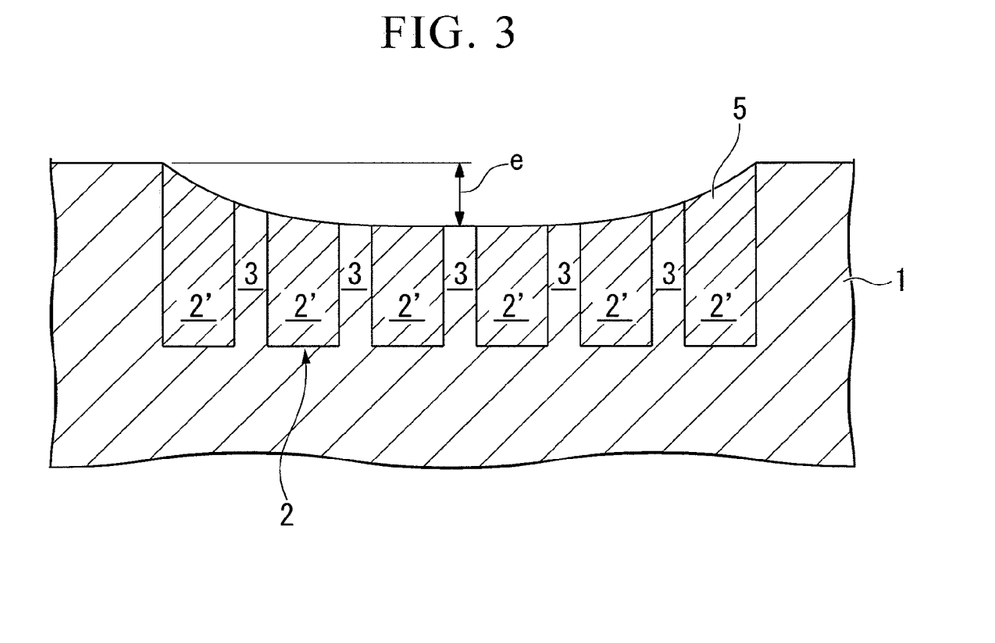
FIG. 3 is a transverse cross-sectional view explaining an erosion phenomenon.

The loss of the barrier metal film 4 and the interlayer insulating film 1 in the space part of line/space of 9 μm/1 μm (e shown in FIG. 3) was measured as erosion. In FIG. 3, the same reference symbols are used for the same members as those shown in FIG. 1, and description thereof is omitted. Moreover, the barrier metal film is not shown in FIG. 3.

"Surface Damage"

The surface of the metal film 5 was observed using a scanning electron microscope (SEM) through magnification of the center of a 100μ/100μ square pad in the center of the wafer. Then, a relative evaluation was performed according to the depth of damage, on a five-point rating scale from A to E in which those having no damage were rated A and those having damage all over the surface were rated E. More specifically, A means no damage, B means a presence of shallow damage, C means a presence of slightly deep damage, D means a presence of deep damage, and E means damage all over the surface. Those rated A or B are usable.

"Corrosion"

The surface of the metal film 5 was observed using a scanning electron microscope (SEM) through magnification of the center of the 100μ/100μ square pad in the center of the wafer. Then, a relative evaluation was performed according to the depth and the number of corrosion pits, on a six-point rating scale from A to F in which those having no corrosion were rated A and those corroded all over the surface were rated F. More specifically, A means no corrosion, B means a small number of shallow pits, C means a large number of shallow pits, D means a presence of slightly deep pits, E means a presence of deep pits, and F means corrosion all over the surface. Those rated A or B are usable.

As shown in Table 1 to Table 3, in all cases of Examples 1 to 25, the polishing speed was 3800 Å/min or higher, which means a sufficiently high polishing speed. Moreover, all samples of Examples 1 to 25 were rated 3.75 or lower in the evaluation of residual copper, and thus were usable. Furthermore, all samples of Examples 1 to 25 showed low degrees of dishing and erosion, and were rated A or B in the evaluations of surface damage and corrosion.

On the other hand, samples of Comparative Examples 1 to 4 were not subjected to addition of imidazole, and thus were poorly rated in the evaluation of residual copper, as compared with that of Example 1. For example, Comparative Example 2, which was the same as Example 2 except for non-addition of imidazole, showed 5.25 in the evaluation of residual copper, which was worse than Example 2, showing 3.75 in the evaluation of residual copper.

Moreover, samples of Comparative Examples 2 to 4, which were not subjected to addition of imidazole, were rated B in the evaluation of surface damage or corrosion. Furthermore, in Comparative Example 1 in which the amount of oleic acid serving as the fatty acid was increased and the amount of polyvinylimidazole polymer serving as the nonionic water-soluble polymer was reduced with respect to Comparative Example 3, the residual copper was slightly reduced, whereas the corrosion was remarkably worsened. If an attempt is made in this way, to reduce residual copper without adding imidazole, other performances are impaired.

In Example 1 in which N-vinylimidazole was added as the imidazole with respect to Comparative Example 2, residual copper was remarkably improved and neither surface damage nor corrosion were found.

In both of Examples 12 and 13 in which N-vinylimidazole was added as the imidazole with respect to Comparative Example 3, less residual copper was found and neither surface damage nor corrosion were found.

In Example 15 in which the amount of oleic acid serving as the fatty acid was increased with respect to Example 1, the residual copper was remarkably improved while surface damage and corrosion slightly remained as compared with Example 1.

This tendency was observed in Comparative Example 1 and Example 16 in which the amount of oleic acid was increased.

That is, remarkable corrosion was observed in Comparative Example 1 in which the amount of oleic acid was increased without adding imidazole, whereas less corrosion and less residual copper were found regardless of the increased amount of oleic acid in Example 16 in which N-substituted imidazole for use in the present invention was added.

In Examples 17 to 24, the amounts of colloidal silica, polyvinylpyrrolidone, ammonia, benzoimidazole, and imidazole were changed. In all cases of Examples 17 to 24, less residual copper was found, and neither surface damage nor corrosion was found.

Furthermore, in Example 25, the oleic acid serving as the fatty acid was replaced with lauric acid, which however showed satisfactory results.

In Comparative Examples 5 to 13, the type of added imidazole was out of the range of the present invention, and therefore poorer ratings were shown in the evaluation of residual copper, as compared with Examples 1 to 25.

Moreover, in many cases of Comparative Examples 5 to 14, surface damage and corrosion were unchanged.

The invention claimed is:

1. A polishing composition for polishing copper or copper alloy, comprising:
   an oxidizing agent (A);
   at least one acids (B) selected from amino acids, carboxylic acids of 8 or less carbon atoms, or inorganic acids;
   a sulfonic acid (C) having an alkyl group of 8 or more carbon atoms;
   a fatty acid (D) having an alkyl group of 8 or more carbon atoms; and
   an N-substituted imidazole (E) represented by the following general formula (1):

[Chemical 1]

(in the formula (1), Ra, Rb, and Rc represent H or an alkyl group of 1 to 4 carbon atoms, and Rd represents a group selected from the group consisting of a benzyl group, a vinyl group, an alkyl group of 1 to 4 carbon atoms, and a group in which a portion of H of these groups has been substituted with OH or $NH_2$).

2. The polishing composition according to claim 1, wherein the N-substituted imidazole is at least one selected from N-vinylimidazole, N-methylimidazole, N-ethylimidazole, N-benzylimidazole, 1,2-dimethylimidazole, N-butylimidazole, or N-(3-aminopropyl)-imidazole.

3. The polishing composition according to claim 1, wherein a concentration of the N-substituted imidazole is 0.005 to 3 mass %.

4. The polishing composition according to claim 1, further comprising an abrasive.

5. The polishing composition according to claim 1, wherein pH thereof is 9 to 11.

6. The polishing composition according to claim 1, further comprising ammonia.

7. The polishing composition according to claim 1, wherein the oxidizing agent (A) is a persulfate.

8. The polishing composition according to claim 1, wherein the at least one acid (B) selected from amino acids, carboxylic acids of 8 or less carbon atoms, or inorganic acids is oxalic acid.

9. The polishing composition according to claim 1, wherein the sulfonic acid (C) having an alkyl group of 8 or more carbon atoms is alkylbenzene sulfonic acid.

10. The polishing composition according to claim 1, wherein the fatty acid (D) having an alkyl group of 8 or more carbon atoms is oleic acid or lauric acid.

11. The polishing composition according to claim 4, wherein the abrasive is colloidal silica.

12. The polishing composition according to claim 1, further comprising a nonionic water-soluble polymer.

13. A polishing method, wherein a metal film composed of copper or copper alloy embedded on an insulating layer which has concave portions and is provided on a substrate, so as to cover the concave portions, or a metal film composed of copper or copper alloy embedded, through a barrier metal film, on an insulating layer which has concave portions and is provided on a substrate, so as to cover the concave portions, is polished by using the polishing composition according to claim 1.

14. The polishing method according to claim 13, wherein the barrier metal film is composed of tantalum or tantalum alloy.

15. A composition providing the polishing composition according to claim 3 by dilution with water.

16. A kit comprising a plurality of types of compositions, which provide the polishing composition of claim 1 by mixing the plurality of types of compositions.

17. A method for producing a semiconductor device, comprising forming a wiring by the polishing method according to claim 13.

* * * * *